United States Patent [19]

Okajima

[11] Patent Number: 4,677,455
[45] Date of Patent: Jun. 30, 1987

[54] SEMICONDUCTOR MEMORY DEVICE

[75] Inventor: Yoshinori Okajima, Yokohama, Japan

[73] Assignee: Fujitsu Limited, Kawasaki, Japan

[21] Appl. No.: 881,475

[22] Filed: Jul. 1, 1986

Related U.S. Application Data

[63] Continuation of Ser. No. 480,584, Mar. 30, 1983, abandoned.

[30] Foreign Application Priority Data

Mar. 20, 1982 [JP] Japan ................................. 57-50092
Mar. 31, 1982 [JP] Japan ................................. 57-51135

[51] Int. Cl.⁴ ............................................. H01L 29/74
[52] U.S. Cl. ........................................ 357/38; 357/36; 357/44; 357/46; 357/50; 357/15; 365/155; 365/156; 365/179; 365/180
[58] Field of Search ................... 357/44, 46, 50, 38, 357/36, 15; 365/155, 156, 179, 180

[56] References Cited

U.S. PATENT DOCUMENTS 3,603,820  9/1971  Schuenemann .................. 365/180
3,623,029 11/1971  Davidson ......................... 365/180
3,953,866  4/1976  Russell .
3,961,351  6/1976  Blatt ................................. 357/92
4,144,586  3/1979  U ..................................... 357/92
4,484,214 11/1984  Misawa ......................... 357/38 X

FOREIGN PATENT DOCUMENTS 7506844  8/1975  Netherlands ..................... 365/154
2058453  of 0000  United Kingdom .

OTHER PUBLICATIONS

IBM Technical Disclosure Bulletin, vol. 22, No. 1, Jun. 1979, Anantha et al., "Memory Cell Using Schottky Collector Vertical PNP Transistors, pp. 128–129, European Search Report, The Hague, Dec. 20, 1985, Examiner: A. Cardon.

Primary Examiner—Martin H. Edlow
Attorney, Agent, or Firm—Staas & Halsey

[57] ABSTRACT

In a semiconductor memory cell having PNPN type memory cells, a vertical PNPN element is used as a load transistor and a sense transistor or a hold transistor, or both. A buried layer is used as a wiring layer for a word line or a bit line, so that the switching speed can be increased and the memory cell area can be decreased.

14 Claims, 14 Drawing Figures

SEMICONDUCTOR MEMORY DEVICE

This is a continuation of co-pending application Ser. No. 480,584 filed Mar. 30, 1983, abandoned.

BACKGROUND OF THE INVENTION

1. Field of the Invention

The present invention relates to a semiconductor memory device, more particularly to a semiconductor memory device having a PNPN type memory cell.

2. Description of the Prior Art

Many bipolar semiconductor memory devices used in recent years employ memory cells with diode loads or Schottky barrier diode (SBD) loads. It is well known, however, that memory cells of this type are not suitable for large capacity high integration density memory devices in which the hold current must be made small. In such memory devices, the resistance values of the memory cells must be made large to make the hold current small. Accordingly, it is difficult to make the cell area small.

Recently, PNPN type memory cells with PNP load transistors or NPN load transistors and I$^2$L type memory cells have come under scrutiny. Of these two types of memory, it is known that the I$^2$L type is generally not able to achieve as high a speed of operation as the PNPN type memory cell.

Conventional semiconductor memory devices having PNPN type memory cells, however, suffer from several drawbacks.

For example, since a buried layer cannot be used as a wiring layer, as in an I$^2$L type memory cell, it is necessary to connect the word lines and the bit lines through contact windows. This results in an increased memory cell area. Also, since the load transistor is formed laterally, the characteristic values of the memory cell vary randomly, which slows the switching speed.

SUMMARY OF THE INVENTION

An object of the present invention is to provide a semiconductor memory device having PNPN type memory cells, wherein by using a buried layer as a wiring layer and by forming a load transistor as a vertical transistor, the cell area is decreased and the switching speed is increased.

In accordance with the present invention, there is provided a semiconductor memory device including a group of pairs of first and second word lines, the first word line connected to a word line drive circuit and the second word line connected to a hold current source; a group of pairs of bit lines; and memory cells arranged at every cross point of a pair of word lines and a pair of bit lines. Each of the memory cells has a pair of PNPN elements connected in parallel between the pair of first and second word lines. A PNPN element in the memory cell has equivalently three transistors, that is, a load transistor, a hold transistor, and a sense transistor. A PNPN element in a memory cell is formed in a region surrounded by isolation regions on and penetrating slightly into a buried layer formed on a semiconductor substrate having one conductivity type. The buried layer has an opposite conductivity type. The load transistor of a PNPN element the hold transistor or the sense transistor or both of a PNPN element are formed as vertical transistors. The buried layer is used as a wiring layer for the first or second word line or the bit line.

DESCRIPTION OF THE PREFERRED EMBODIMENTS

Before describing the preferred embodiments, a discussion will be made of an actual prior art PNPN memory cell.

Figure 1:
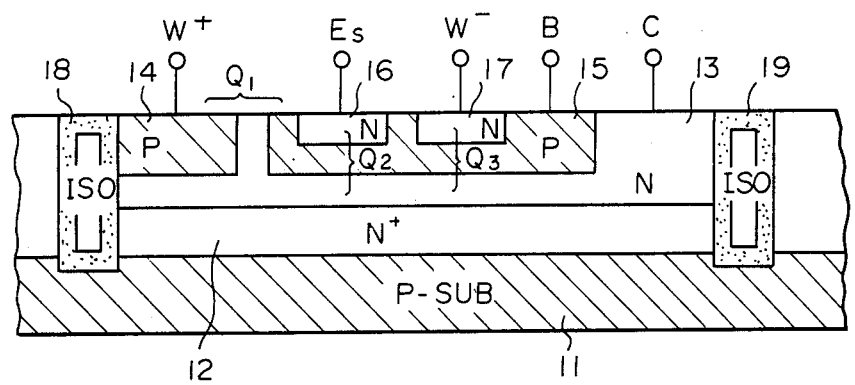
FIG. 1 is a cross-sectional vertical view of a prior art PNPN type memory cell.
Figure 2:
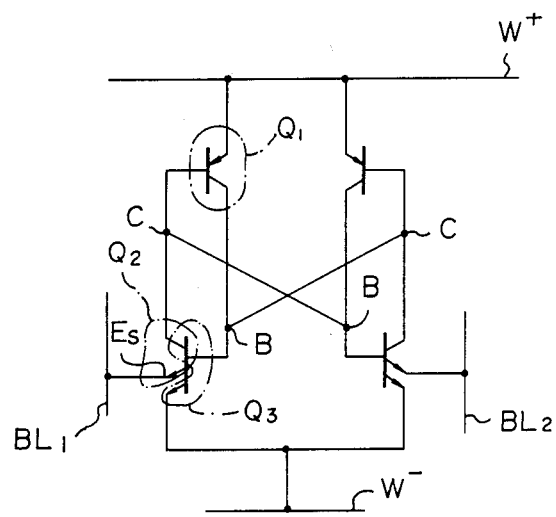
FIG. 2 is an equivalent circuit diagram of a first type PNPN memory cell.

A prior art PNPN type memory cell is illustrated in FIG. 1. An equivalent circuit diagram of the PNPN type memory cell of FIG. 1 is illustrated in FIG. 2. The memory cell of FIG. 1 is formed on a P-type semiconductor substrate (P-SUB) 11. A portion corresponding to one PNPN element as illustrated in the equivalent circuit diagram of FIG. 2 is formed in the region surrounded and isolated by the isolating regions (ISO) 18 and 19. On the P-type semiconductor substrate 11, a high density N$^+$-type buried layer 12 is formed. An N-type region 13 is formed on the buried layer 12. In the N-type region 13, two P-type regions 14 and 15 are formed. In the P-type region 15, two N-type regions 16 and 17 are formed.

As shown in FIG. 2, three pairs of PN-junctions $Q_1$, $Q_2$, and $Q_3$, each of these pairs equivalently acting as a transistor, are formed in the PNPN element. The PNP type transistor $Q_1$ is formed by using the P-type region 14 as its emitter region, the N-type region 13 as its base region, and the P-type region 15 as its collector region. The NPN type transistor $Q_2$ is formed by using the N-type region 13 as its collector region, the P-type region 15 as its base region, and the N-type region 16 as its emitter region. The NPN type transistor $Q_3$ is formed by using the N-type region 13 as its collector region, the P-type region 15 as its base region, and the N-type region 17 as its emitter region. The P-type region 14 is connected to a first word line W+ through a contact window. The N-type region 17 is connected to a second word line W− through a contact window. The N-type region 16 is led out through a contact window as a sense emitter $E_S$ and connected to a bit line $BL_1$. The N-type region 13 is led out to a point C through a contact window. The P-type region 15 is lead out to a point B through a contact window.

Figure 3:
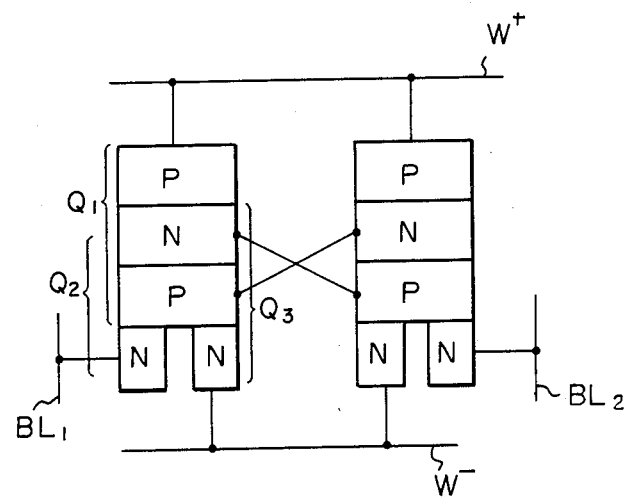
FIG. 3 is a model diagram of the PNPN type memory cell.
Figure 4:
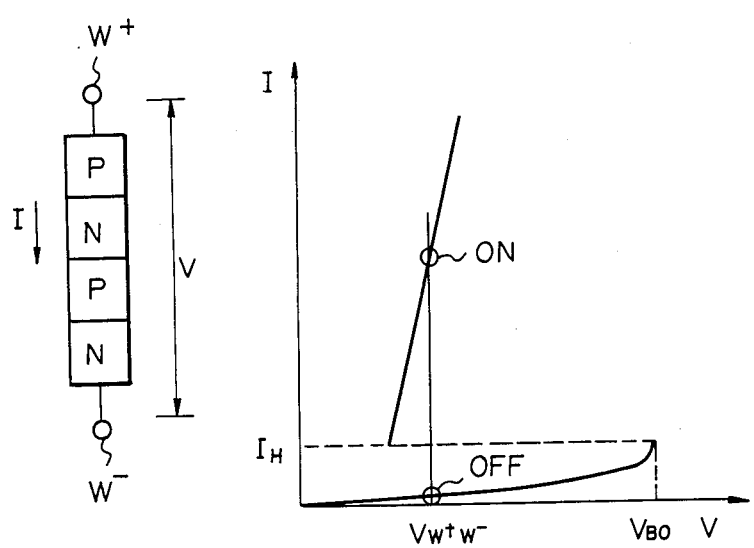
FIG. 4 is a characteristic diagram of a PNPN element.

The PNPN type memory cell of FIG. 1 is considered as a memory cell in which the PNP transistor $Q_1$ is used as a load and the NPN transistor $Q_3$ is kept at an ON or OFF state, in comparison with a diode resistance load type memory cell. However, in the above-mentioned PNPN type memory cell, the base-collector junction of the PNP-type transistor $Q_1$ and the base-collector junction of the NPN-type transistor $Q_3$ are common, as shown in the model diagram of FIG. 3. Therefore, it is impossible to independently control the collector current of $Q_1$ and the base current of $Q_3$ in the equivalent transistor circuit shown in FIG. 2. Actually, in most cases, the current-voltage characteristic of the PNPN element connected between the first and the second word lines W+ and W− is represented by an inherent characteristic curve having negative resistance, as shown in FIG. 4. Thus, in the memory cell of FIG. 2, an ON-state PNPN element and OFF-state PNPN element are made between two word lines W+ and W− by using the fact that there are two stable current values for one voltage value in the characteristic curve.

In the above-mentioned prior art PNPN type memory cell, since it is impossible to use a buried layer as a wiring layer, as in an $I^2L$ type memory cell, it is necessary to distribute the wiring of the word lines W+ and W− through the contact windows. This is disadvantageous in terms of cell area. Further, in the above-mentioned prior art PNPN type memory cell, even though the transistors $Q_2$ and $Q_3$ are formed as vertical transistors, and the load transistor $Q_1$ is formed as a lateral transistor. Therefore, the characteristic values of the memory cell, for example, current amplification $h_{FE}$, are apt to suffer from random variation. The switching speed is especially affected adversely by this random variation.

Figure 5:
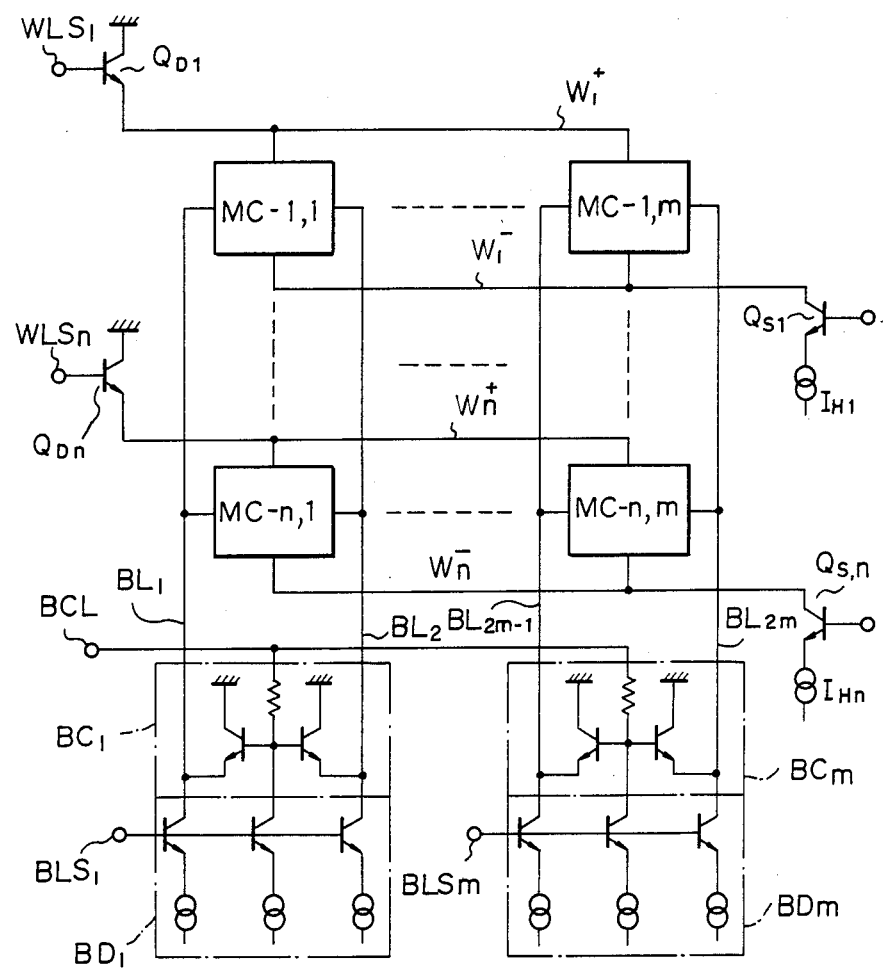
FIG. 5 is a schematic circuit diagram of a semiconductor memory device having the first type PNPN memory cell according to the present invention.
Figure 6:
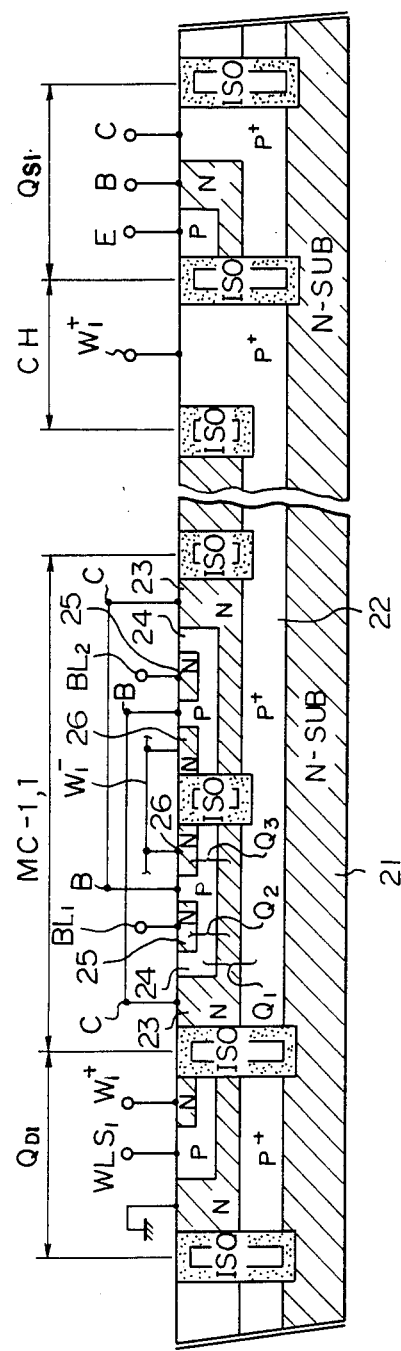
FIG. 6 is a cross-sectional vertical view of a semiconductor memory device in accordance with a first embodiment of the present invention.

A first embodiment of the present invention is illustrated in FIG. 5 and FIG. 6. FIG. 5 is a schematic circuit diagram of a semiconductor memory device containing memory cells like the PNPN memory cell of FIG. 2.

The semiconductor memory device of FIG. 5 comprises a group of pairs of first word lines $W_1^+, ---, W_n^+$ and second word lines $W_1^-, ---, W_n^-$; a group of pairs of bit lines $BL_1$ and $BL_2, ---, BL_{2m-1}$ and $BL_{2m}$; and memory cells MC-$_{1,1}, ---,$ MC-$_{n,m}$. The first word line $W_i^+$ is connected to a word line drive transistor $Q_{Di}$, and the second word line $W_i^-$ is connected to a hold current source $I_{Hi}$ through a discharge transistor $Q_{Si}$. The memory cell MC-$_{i,j}$ is connected between the first word line $W_i$ and the second word line $W_i^-$ and is also connected to one pair of bit lines $BL_{2j-1}$ is connected to a bit line clamp circuit $BC_j$ and to a bit line drive circuit $BD_j$. A word line select signal $WLS_j$ is applied to the base of the word line drive transistor $Q_{Di}$, and a bit line select signal $BLS_j$ is applied to the bit line drive circuit $BD_j$. A bit line clamp level signal BCL is applied to all the bit line clamp circuits $BC_1$ through $BC_m$. Each memory cell MC-$_{i,j}$ has an equivalent circuit of FIG. 2.

A cross-sectional vertical view of the semiconductor memory device in accordance with the first embodiment of the present invention is illustrated in FIG. 6. The semiconductor memory device of FIG. 6 is formed on an N-type semiconductor substrate (N-SUB) 21. On the semiconductor substrate 21, a high density P+-type buried layer 22 is formed. On the buried layer 22, a memory cell MC-$_{1,1}$ is formed. As described above, the memory cell MC-$_{1,1}$ has a pair of PNPN elements, and each PNPN element is formed in a area surrounded by isolation regions ISO. In this area, an N-type region 23 is formed on the buried layer 22, a P-type region 24 is formed on the N-type region 23, and two N-type regions 25 and 26 are formed separately on the divided p-type region 24. The load transistor $Q_1$ in the equivalent circuit of FIG. 2 is formed vertically by the P+-type buried layer 22, the N-type region 23, and the P-type region 24. The sense transistor $Q_2$ is formed vertically by the N-type region 23, the P-type region 24, and the N-type region 25. The hold transistor $Q_3$ is formed vertically by the N-type region 23, the P-type region 24, and the N-type region 26.

The N-type region 23, the P-type region 24, and the N-type regions 25 and 26 are connected to metal wiring lines through contact windows (not shown) on the surface opposite to the N-type substrate 21. The N-type region 23 of one PNPN element is connected to the P-type region 24 of the other PNPN element by a metal wiring line. The N-type region 25 of one PNPN element is connected to the bit line $BL_1$, and the N-type region 25 of the other PNPN element is connected to the bit line $BL_2$. The N-type region 26 is connected to the second word line $W_1^-$. The P+-type buried layer 22 is formed commonly for the memory cells MC-$_{1,1}, ---,$ MC-$_{1,m}$ connected to the first word line $W_1^+$ and connected to the metal wiring line at the contact hole CH. Thus, the P+-type buried layer 22 is used as the wiring layer for the first word line $W_1^+$. An NPN transistor $Q_{D1}$ and a PNP transistor $Q_{S1}$ may be formed as shown in FIG. 6.

In accordance with the first embodiment of the present invention, all the transistors $Q_1$, $Q_2$, and $Q_3$ of the PNPN element are formed vertically. This accordingly increases the switching speed and decreases the variation of the characteristic values. Also, the buried layer is used as a wiring layer for a first workd line $W_i^+$. This accordingly decreases the metal wiring lines and eliminates two contact windows per memory cell. Thus, the area of memory cells can be decreased and the yield rate can be increased.

Figure 7:
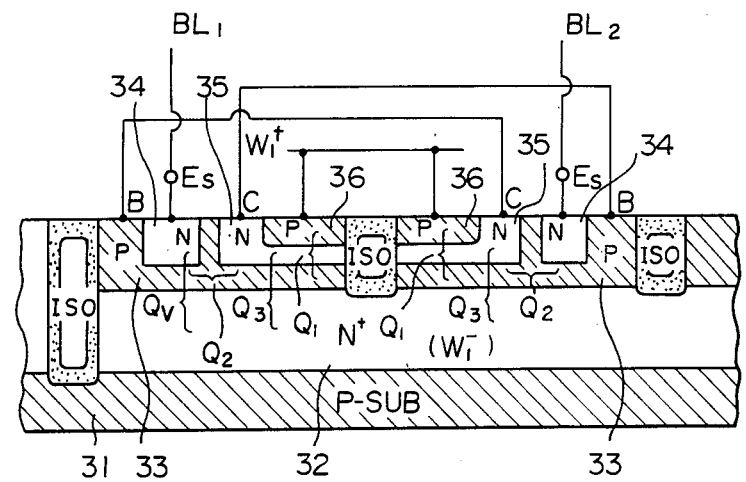
FIG. 7 is a cross-sectional vertical view of a semiconductor memory device in accordance with a second embodiment of the present invention.

A semiconductor memory device in accordance with a second embodiment of the present invention is illustrated in FIG. 7. The semiconductor memory device of FIG. 7 has PNPN type memory cells with the equivalent circuit of FIG. 2. The structure of the memory cell is different from that of the memory cell of FIG. 6. The semiconductor memory device of FIG. 7 is formed on a P-type semiconductor substrate 31. A high density N+-type buried layer 32 is formed on the P-type semiconductor substrate 31, and a P-type region 33 is formed on the N+-type buried layer 32. Two N-type regions 34 and 35 are formed separately on the divided P-type region 33. A P-type region 36 is formed on the N-type region 35. The load transistor $Q_1$ of the PNPN element is formed vertically by the P-type region 36, the N-type region 35, and the P-type region 33; and the hold transistor $Q_3$ is formed vertically by the N+-type buried layer 32, the P-type region 33, and the N-type region 35. The sense transistor $Q_2$ is formed laterally by the N-type region 34, the P-type region 33, and the N-type region 35. The P-type region 33, the N-type regions 34 and 35, and the P-type region 36 are connected to metal wiring lines through contact windows (not shown). The P-type region 33 of one PNPN element is connected to the N-type region 35 of the other PNPN element by a metal wiring line. The N-type region 34 is connected to the bit line $BL_1$ or $BL_2$. The P-type region 36 is connected to the first word line $W_1+$. The N+-type buried layer 32 is used as a wiring layer for the second word line $W_1-$.

In accordance with the second embodiment of the present invention as shown in FIG. 7, the load transistor $Q_1$ and the hold transistor $Q_3$ are formed vertically. This accordingly increases the switching speed. Also, the N+ buried layer 32 is used as a wiring layer for the second word line $w-$. This accordingly decreases the metal wiring lines and eliminates two contact windows per memory cell.

Figure 8:
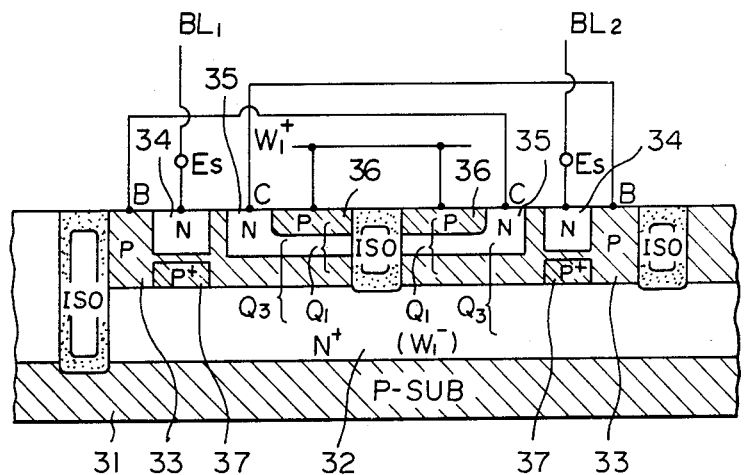
FIG. 8 is a cross-sectional vertical view of a semiconductor memory device in accordance with a third embodiment of the present invention.

A semiconductor memory device in accordance with a third embodiment of the present invention is illustrated in FIG. 8. The semiconductor memory device of FIG. 8 has the same structure for its PNPN element as the device of FIG. 7, except that a high density (high impurity concentration) P+-type region 37 is formed in the P-type region 33 between the N+-type buried layer 32 and the N-type region 34 in order to decrease the adverse influence due to a parasitic transistor $Q_V$ formed by the N+-type buried layer 32, the P-type region 33, and the N-type region 34.

In the semiconductor memory device of FIG. 7 or FIG. 8, the sense transistor $Q_2$ can be replaced by the hold transistor $Q_3$. In this case, the N+-type buried layer 32 may be used as a wiring layer for the bit line $BL_1$ or $BL_2$.

Figure 9A:
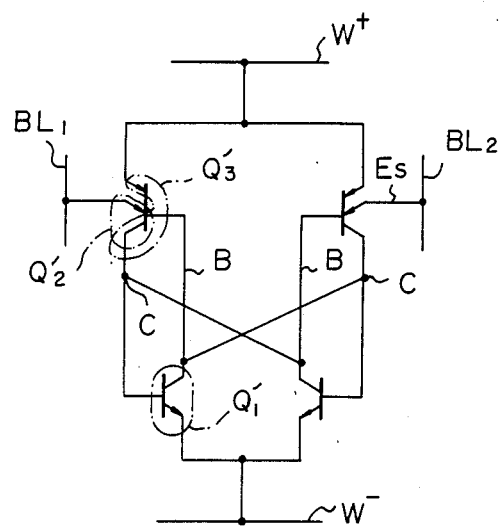
FIGS. 9(A) and 9(B) are an equivalent circuit diagram and a model diagram of a second type PNPN memory cell.
Figure 9B:
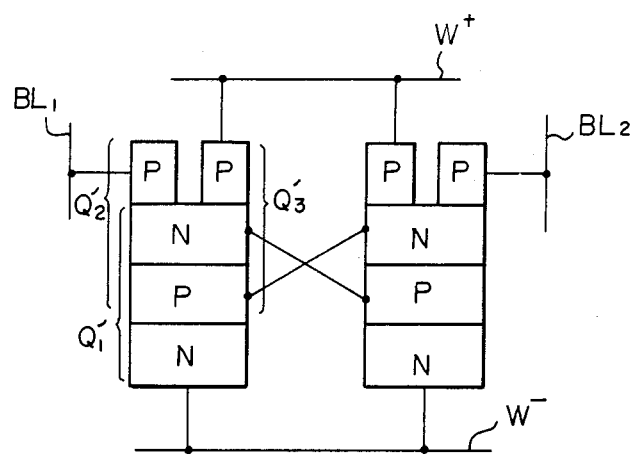

A second type of PNPN memory cell is illustrated in FIGS. 9(A) and 9(B). FIG. 9(A) is an equivalent circuit diagram of this PNPN memory cell, and FIG. 9(B) is its model diagram. In the PNPN memory cell of FIGS. 9(A) and 9(B), an NPN transistor $Q_1'$ as used as a load transistor, and PNP transistors $Q_2'$ and $Q_3'$ are used as a sense transistor and a hold transistor. A schematic circuit diagram of a semiconductor memory device having the memory cell of FIGS. 9(A) and 9(B) is given in FIG. 10. In the semiconductor memory device of FIG. 10, the polarity of the signal lines and the conductivity type of the transistors are reversed from the semiconductor memory device of FIG. 5. Thus, the positive word lines $W_1+$ through $W_n+$ are connected to the hold current sources $I_{H1}$ through $I_{Hn}$, and the negative word lines $W_1-$ through $W_n-$ are connected to the word line drive PNP transistors $Q_{D1}$ through $Q_{Dn}$.

Figure 10:
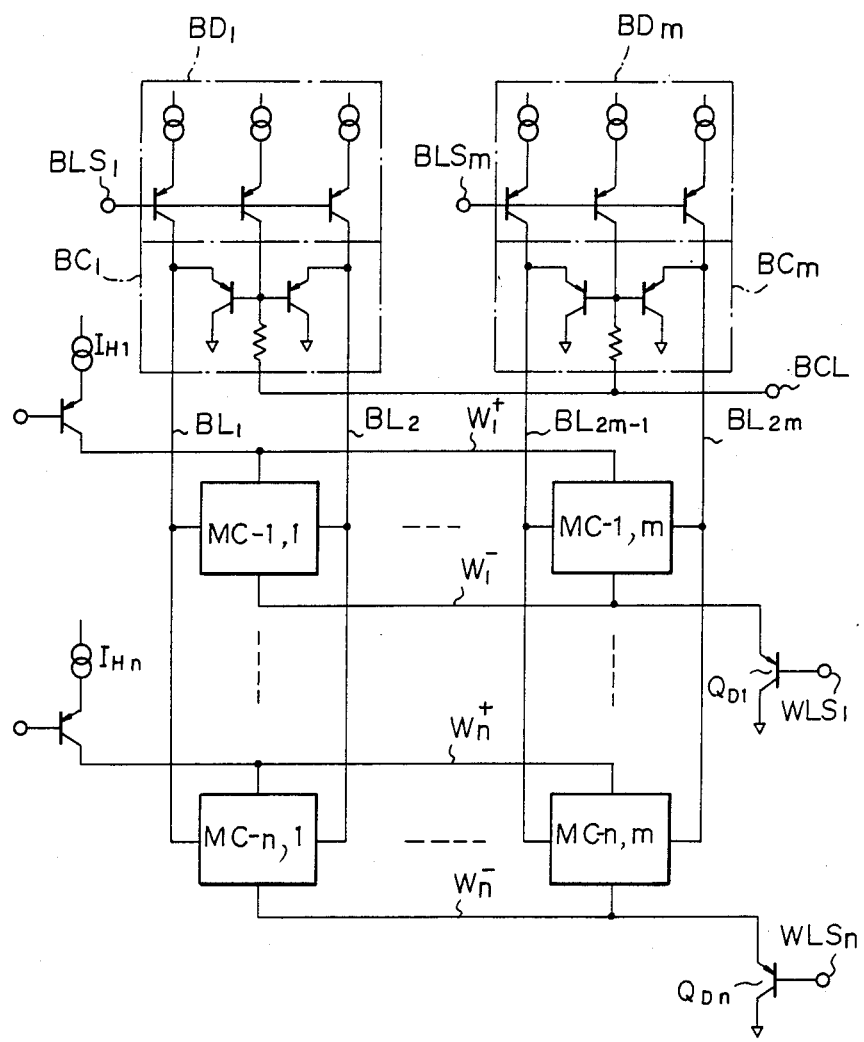
FIG. 10 is a schematic circuit diagram of a semiconductor memory device having the second type PNPN memory cell according to the present invention.

The semiconductor memory device of FIG. 10 is constructed by reversing the conductivity type of the semiconductor memory device of FIG. 5. Some embodiments of the present invention having the PNPN element of FIGS. 9(A) and 9(B) will now be described.

Figure 11:
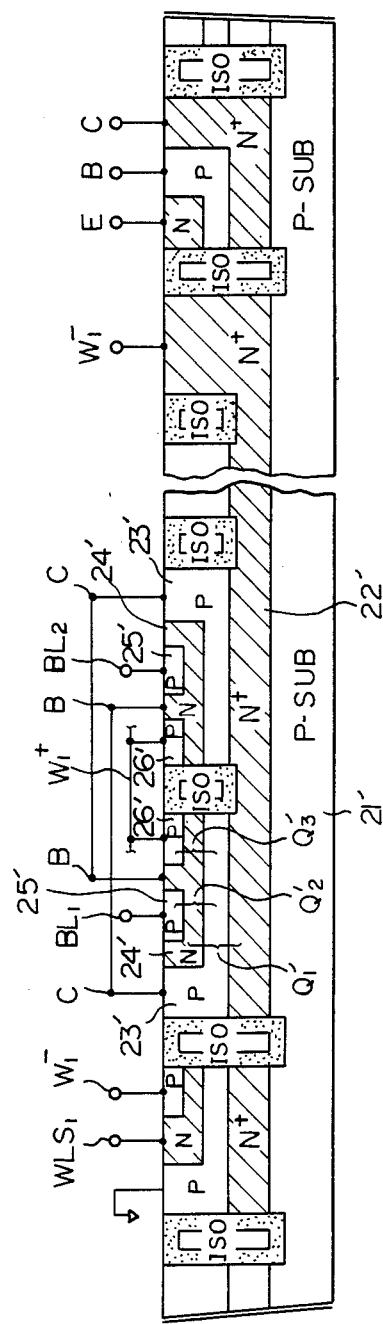
FIG. 11 is a cross-sectional vertical view of a semiconductor memory device in accordance with a fourth embodiment of the present invention.

A semiconductor memory device in accordance with a fourth embodiment of the present invention is illustrated in FIG. 11. The semiconductor memory device of FIG. 11 has the same construction as the semiconductor memory device of FIG. 6, except that the conductivity type of each corresponding portion is reversed. In the semiconductor memory device of FIG. 11, each corresponding portion is denoted by the same reference numeral as in FIG. 6 but with an apostrophe added. In this embodiment, the N+-type buried layer 22' is used as a wiring layer for the negative word line $W_1-$, corresponding to the first word line $W_1+$ in FIG. 6.

Figure 12:
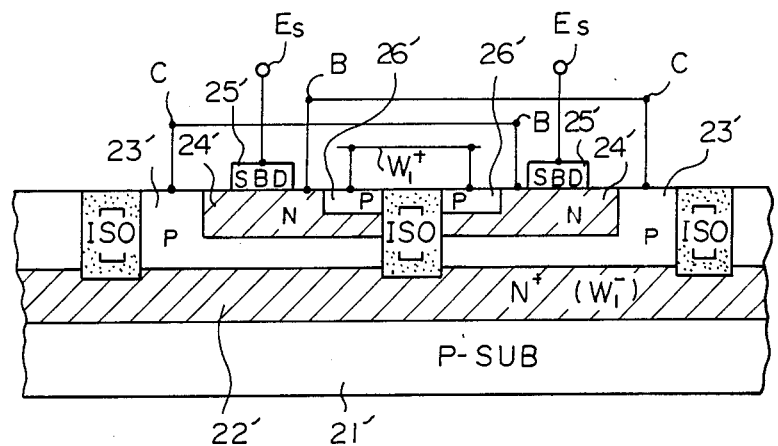
FIG. 12 is a cross-sectional vertical view of a semiconductor memory device in accordance with a fifth embodiment of the present invention.

A semiconductor memory device in accordance with a fifth embodiment of the present invention is illustrated in FIG. 12. The semiconductor memory device of FIG. 12 has the same construction as the semiconductor memory device of FIG. 11, except that the base-emitter junction of the sense transistor $Q_2$ is formed as a Schottky barrier diode (SBD). It is well known in the art that the sensing of the state of a memory cell can be speeded up by using a Schottky barrier diode.

Figure 13:
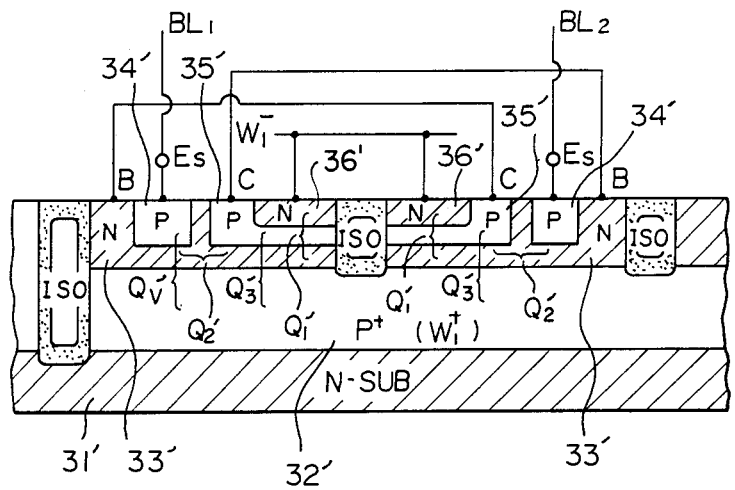
FIG. 13 is a cross-sectional vertical view of a semiconductor memory device in accordance with a sixth embodiment of the present invention.

A semiconductor memory device in accordance with a sixth embodiment of the present invention is illustrated in FIG. 13. The semiconductor memory device of FIG. 13 has the same construction as the semiconductor memory device of FIG. 7, except that the conductivity type of each corresponding portion is reversed. In FIG. 13, the corresponding portions are denoted by the same reference numerals as in FIG. 7 but with an apostrophe added.

I claim:

1. A semiconductor memory device, comprising:
a semiconductor substrate having a first conductivity type;
a pair of first and second word lines;
a word line drive circuit operatively connected to said first word line;
a hold current source operatively connected to said second word line;
a pair of bit lines forming a cross point with said pair of word lines;
a buried layer having a second conductivity type, opposite to said first conductivity type, formed on said semiconductor substrate and used as said first word line;
first isolation regions formed above and slightly penetrating into said buried layer;
second isolation regions penetrating through said buried layer and slightly into said semiconductor substrate; and
a memory cell arranged at the cross point of said pair of word lines and said pair of bit lines, said memory cell comprising a pair of cross-coupled PNPN elements forming a flip-flop, said pair of PNPN elements connected in parallel between said first and second word lines, each said PNPN element being laterally surrounded by said first isolation regions and comprising:
a first region, having said first conductivity type, formed on said buried layer with only a PN junction therebetween;
a second region, having said second conductivity type, formed on said first region and connected to said first region in said PNPN element paired therewith;
a third region, having said first conductivity type, formed on said second region; and
a fourth region having the first conductivity type, formed on said second region and separated from said third region by said second region, a load transistor of said PNPN element being formed vertically by said buried layer and said first and second regions, said load transistor having a base formed by said first region, a hold transistor of said PNPN element being formed vertically by said first, second and third regions, and a sense transistor of said PNPN element being formed vertically by said first, second and fourth regions.

2. A semiconductor memory device as defined in claim 1, wherein said first conductivity type is an N type and said second conductivity type is a P type.

3. A semiconductor memory device as defined in claim 1, wherein said first conductivity type is a P type, and said second conductivity type is an N type.

4. A semiconductor memory device, comprising:
a semiconductor substrate having a first conductivity type;
a pair of first and second word lines;
a word line drive circuit operatively connected to said first word line;
a hold current source operatively connected to said second word line;
a pair of bit lines forming a cross point with said pair of word lines;
a buried layer having a second conductivity type, opposite to said first conductivity type, formed on said semiconductor substrate and used as said first word line;
first isolation regions formed above and slightly penetrating into said buried layer;
second isolation regions penetrating through said buried layer and slightly into said semiconductor substrate; and
a memory cell arranged at the cross point of said pair of word lines and said pair of bit lines, said memory cell comprising a pair of cross-coupled PNPN elements forming a flip-flop, said pair of PNPN elements connected in parallel between said first and second word lines, each said PNPN element being formed in a region surrounded by said first isolation regions and comprising:
a first region, having said first conductivity type, formed on said buried layer with only a PN junction therebetween;
a second region, having said second conductivity type, formed on said first region and connected to said first region in said PNPN element paired therewith;
a third region, having said first conductivity type, formed on said second region; and
a metal layer formed on said third region by evaporation, said third region and said metal layer forming a Schottky barrier diode, and a load transistor of said PNPN element being formed vertically by said buried layer and said first and second regions, said load transistor having a base formed by said first region a hold transistor of said PNPN element being formed vertically by said first, second and third regions, and sense transistor of said PNPN element being formed vertically by said metal layer and said first and second regions.

5. A semiconductor memory device, comprising:
a semiconductor substrate having a first conductivity type;
a pair of first and second word lines;
a word line drive circuit operatively connected to said first word line;
a hold current source operatively connected to said second word line;
a pair of bit lines forming a cross point with said pair of word lines;
a buried layer having a second conductivity type, opposite to said first conductivity type, formed on said semiconductor substrate and used as said second word line;
first isolation regions formed above and slightly penetrating into said buried layer;
second isolation regions penetrating through said buried layer and slightly into said semiconductor substrate; and
a memory cell arranged at the cross point of said pair of word lines and said pair of bit lines, said memory cell comprising a pair of cross-coupled PNPN elements forming a flip-flop, said pair of PNPN elements connected in parallel between said first and second word lines, each said PNPN element being formed in a region surrounded by said first isolation regions and comprising:
a first region, having said first conductivity type, formed on said buried layer with only a PN junction therebetween;
a second region, having said second conductivity type, formed on said first region and connected to said first region in said PNPN element paired therewith;
a third region, having said first conductivity type, formed on said second region; and
a fourth region having said second conductivity type formed on said first region and separated from said second region by said first region, a load transistor of said PNPN element being formed vertically by said first, second and third regions, said load transistor having a base formed by said first region, a hold transistor of said PNPN element being formed vertically by said buried layer and said first and second regions, and a sense transistor of said PNPN element being formed laterally by said second, first and fourth regions.

6. A semiconductor memory device as defined in claim 5, wherein said PNPN element further comprises a fifth region, having said first conductivity type with a higher density than said first region, formed in said first region between said buried layer and said fourth region, and thereby preventing a parasitic transistor from being formed by said buried layer and said first and fourth regions.

7. A semiconductor memory device as defined in claim 5, wherein said first conductivity type is an N type and said second conductivity type is a P type.

8. A semiconductor memory device as defined in claim 5, wherein said first conductivity type is a P type and said second conductivity type is an N type.

9. A semiconductor memory cell, comprising:
a semiconductor substrate having a first conductivity type;
a buried layer having a second conductivity type, opposite to said first conductivity type, formed on said semiconductor substrate and used as one among a group of word and bit lines;
a first region having said first conductivity type, formed on said buried layer;
a second region having said second conductivity type, formed on said first region;
a third region having said first conductivity type, formed on said second region;
a fourth region having said first conductivity type, formed on said second region and separated from said third region by said second region; and
isolation regions formed through said first, second, third and fourth regions and slightly penetrating said buried layer, thereby forming said memory cell from said first, second, third and fourth regions and bounded by said isolation regions, said memory cell comprising a pair of cross-coupled PNPN elements.

10. A semiconductor memory cell as set forth in claim 9, wherein each of said pair of PNPN elements comprises a load transistor, a hold transistor and a sense transistor, said sense transistor being formed as a lateral transistor.

11. A semiconductor memory cell as set forth in claim 10, further comprising a fifth region having said first conductivity type with a level of impurity higher than that of said first region, formed in said first region between said buried layer and said fourth region, thereby preventing a parasitic transistor from being formed by said buried layer, said first region and said fourth region.

12. A semiconductor memory cell as set forth in claim 9, wherein each of said pair of PNPN elements comprises a load transistor, a hold transistor and a sense transistor, said hold transistor being formed as a lateral transistor.

13. A semiconductor memory cell as set forth in claim 12, further comprising a fifth region having said first conductivity type with a level of impurity higher than that in said first region, formed in said first region between said buried layer and said fourth region, thereby preventing a parasitic transistor from being formed by said buried layer, said first region and said fourth region.

14. A semiconductor memory cell as set forth in claim 9, further comprising:
    contact windows formed on said first, second, third and fourth regions;
    a pair of first and second word lines;
    a word line drive circuit operatively connected to said first word line;
    a hold current source operatively connected to said second word line; and
a pair of bit lines, and
wherein said buried layer is used as one line among a group formed of said word lines and said bit lines, the remaining lines of said group making contact with said first, second, third and fourth regions through said contact windows.

* * * * *

UNITED STATES PATENT AND TRADEMARK OFFICE
CERTIFICATE OF CORRECTION

PATENT NO. : 4,677,455

DATED : June 30, 1987

INVENTOR(S) : Okajima

It is certified that error appears in the above-identified patent and that said Letters Patent is hereby corrected as shown below:

ON THE TITLE PAGE

[30] Foreign Application Priority Data, "Mar. 20, 1982"

should be --Mar. 30, 1982--.

Signed and Sealed this

Twenty-ninth Day of March, 1988

Attest:

DONALD J. QUIGG

*Attesting Officer*  *Commissioner of Patents and Trademarks*